US012430479B1

(12) United States Patent
Klein et al.

(10) Patent No.: US 12,430,479 B1
(45) Date of Patent: Sep. 30, 2025

(54) SYSTEMS AND METHODS FOR GENERATIVE BUILDING DESIGN AND MANUFACTURER INTEGRATION

(71) Applicant: Generate Technologies Inc., Boston, MA (US)

(72) Inventors: John Klein, Boston, MA (US); Robert W. Uhlenbrock, Cincinnati, OH (US); Katherine Fairbanks, Cincinnati, OH (US); John Fechtel, Gainesville, FL (US); Neil Chatterjee, Duivendrecht Noord-Holland (NL); Marks J. Grikis, Riga (LV)

(73) Assignee: Generate Technologies Inc., Boston, MA (US)

( * ) Notice: Subject to any disclaimer, the term of this patent is extended or adjusted under 35 U.S.C. 154(b) by 0 days.

(21) Appl. No.: 19/003,325

(22) Filed: Dec. 27, 2024

Related U.S. Application Data

(60) Provisional application No. 63/719,517, filed on Nov. 12, 2024.

(51) Int. Cl.
*G06F 30/13* (2020.01)
(52) U.S. Cl.
CPC .................. *G06F 30/13* (2020.01)
(58) Field of Classification Search
CPC .................. G06F 30/00; G06F 30/13
(Continued)

(56) References Cited

U.S. PATENT DOCUMENTS

| 6,628,279 B1 | 9/2003 | Schell et al. |
| 10,260,232 B1 | 4/2019 | Conboy |

(Continued)

FOREIGN PATENT DOCUMENTS

| CN | 118642376 A | * | 9/2024 |
| WO | WO2022169918 A2 | | 8/2022 |

OTHER PUBLICATIONS

Farias, Francisco, "Contemporary Strategies for Sustainable Design", May 2013, Dissertation, Office of Graduate Studies of Texas A&M University. (Year: 2013).*

(Continued)

*Primary Examiner* — Cedric Johnson
(74) *Attorney, Agent, or Firm* — Carr & Ferrell LLP

(57) ABSTRACT

A computer-aided system and associated method for automated building design includes receiving input parameters and generating a three-dimensional parametric computer model of a building frame and populating the three-dimensional computer building model with generic and manufacturer-specific products by accessing internal and external data sources. The populated computer model undergoes real-time simulation to analyze regulatory compliance, verify engineering requirements including load calculations, and evaluate cost considerations. Based on simulation results, the method generates output documents including requests for proposals (RFP documents) for contractors, requests for quotations (RFQs) for vendors, and regulatory compliance documentation. These documents are transmitted to respective stakeholders through a secure data exchange protocol. The method further includes receiving responses to the generated RFP documents/RFQs.

20 Claims, 8 Drawing Sheets

(58) Field of Classification Search
USPC .......................................................... 703/1
See application file for complete search history.

(56) References Cited

U.S. PATENT DOCUMENTS

| | | | |
|---|---|---|---|
| 10,290,004 | B1 | 5/2019 | Conboy |
| 10,695,597 | B2 | 6/2020 | Conboy |
| 10,814,150 | B2 | 10/2020 | Conboy |
| 11,074,374 | B2 | 7/2021 | Tierney et al. |
| 11,232,508 | B2 | 1/2022 | Krappè |
| 11,395,931 | B2 | 7/2022 | Conboy |
| 11,400,324 | B2 | 8/2022 | Conboy |
| 11,686,105 | B2 | 6/2023 | Beyreuther et al. |
| 11,702,837 | B2 | 7/2023 | Beyreuther et al. |
| 11,826,592 | B2 | 11/2023 | Conboy |
| 11,865,390 | B2 | 1/2024 | Conboy |
| 11,865,394 | B2 | 1/2024 | Conboy |
| 11,960,798 | B1 | 4/2024 | Cudzik et al. |
| 11,972,174 | B2 | 4/2024 | Ayalon |
| 11,977,821 | B1 | 5/2024 | Marsh et al. |
| 11,993,927 | B2 | 5/2024 | Beyreuther et al. |
| 12,226,661 | B2 | 2/2025 | Conboy |
| 2007/0226648 | A1 | 9/2007 | Hudson et al. |
| 2019/0168036 | A1 | 6/2019 | Conboy |
| 2019/0168047 | A1 | 6/2019 | Conboy |
| 2019/0168410 | A1 | 6/2019 | Conboy |
| 2019/0169837 | A1 | 6/2019 | Conboy |
| 2019/0169841 | A1 | 6/2019 | Conboy |
| 2019/0171999 | A1 | 6/2019 | Conboy |
| 2019/0172071 | A1 | 6/2019 | Conboy |
| 2019/0172149 | A1 | 6/2019 | Conboy |
| 2019/0172160 | A1 | 6/2019 | Conboy |
| 2019/0172161 | A1 | 6/2019 | Conboy |
| 2022/0016461 | A1 | 1/2022 | Conboy |
| 2022/0136232 | A1 | 5/2022 | Schneider et al. |
| 2022/0136234 | A1 | 5/2022 | Schneider et al. |
| 2022/0196491 | A1 | 6/2022 | Dubov |
| 2022/0251836 | A1 | 8/2022 | Mathey et al. |
| 2022/0275634 | A1 | 9/2022 | Malczyk et al. |
| 2022/0275635 | A1 | 9/2022 | Malczyk et al. |
| 2022/0362600 | A1 | 11/2022 | Conboy |
| 2024/0252857 | A1 | 8/2024 | Conboy |
| 2024/0252866 | A1 | 8/2024 | Conboy |
| 2024/0252870 | A1 | 8/2024 | Conboy |
| 2024/0257265 | A1 | 8/2024 | Conboy |
| 2024/0366982 | A1 | 11/2024 | Conboy |
| 2025/0041636 | A1 | 2/2025 | Conboy |

OTHER PUBLICATIONS

Park, Kyoung-Jun et al., "Structuring a BIM Service Scoping, Tendering, Executing, and Wrapping-Up (STEW) Guide for Public Owners", Mar. 23, 2022, Applied Sciences, MDPI. (Year: 2022).*

Toussant, Luis et al., "PLM-Based Approach for Design Verification and Validation using Manufacturing Process Knowledge", 2010, Systemics, Cybernetics and Informatics, vol. 8, No. 1. (Year: 2010).*

"Freres Lumber Mass Plywood Panels Awarded Patents in U.S. and Canada; MPP Passes Fire Safety Standards," News Release, Lyons, Ore. Jan. 31, 2019, 2 pages.

"Lakehead University team patents design for product for mass timber high-rises," NWOnewswatch.com, <https://www.nwonewswatch.com/local-news/lakehead-university-team-patents-design-for-product-for-mass-timber-high-rises-5312618>, Apr. 29, 2022, 4 pages.

"Dialog Pursues Global Patents for Structural System to Bring Mass Timber Technology to High Rise Buildings," PR Newswire, <https://www.prnewswire.com/news-releases/dialog-pursues-global-patents-for-structural-system-to-bring-mass-timber-technology-to-high-rise-buildings-301438343.html>, Dec. 7, 2021, 4 pages.

"Brooklyn Mass Timber House," world-architects.com, <https://www.world-architects.com/en/architecture-news/reviews/brooklyn-mass-timber-house>, Oct. 30, 2023, 18 pages.

* cited by examiner

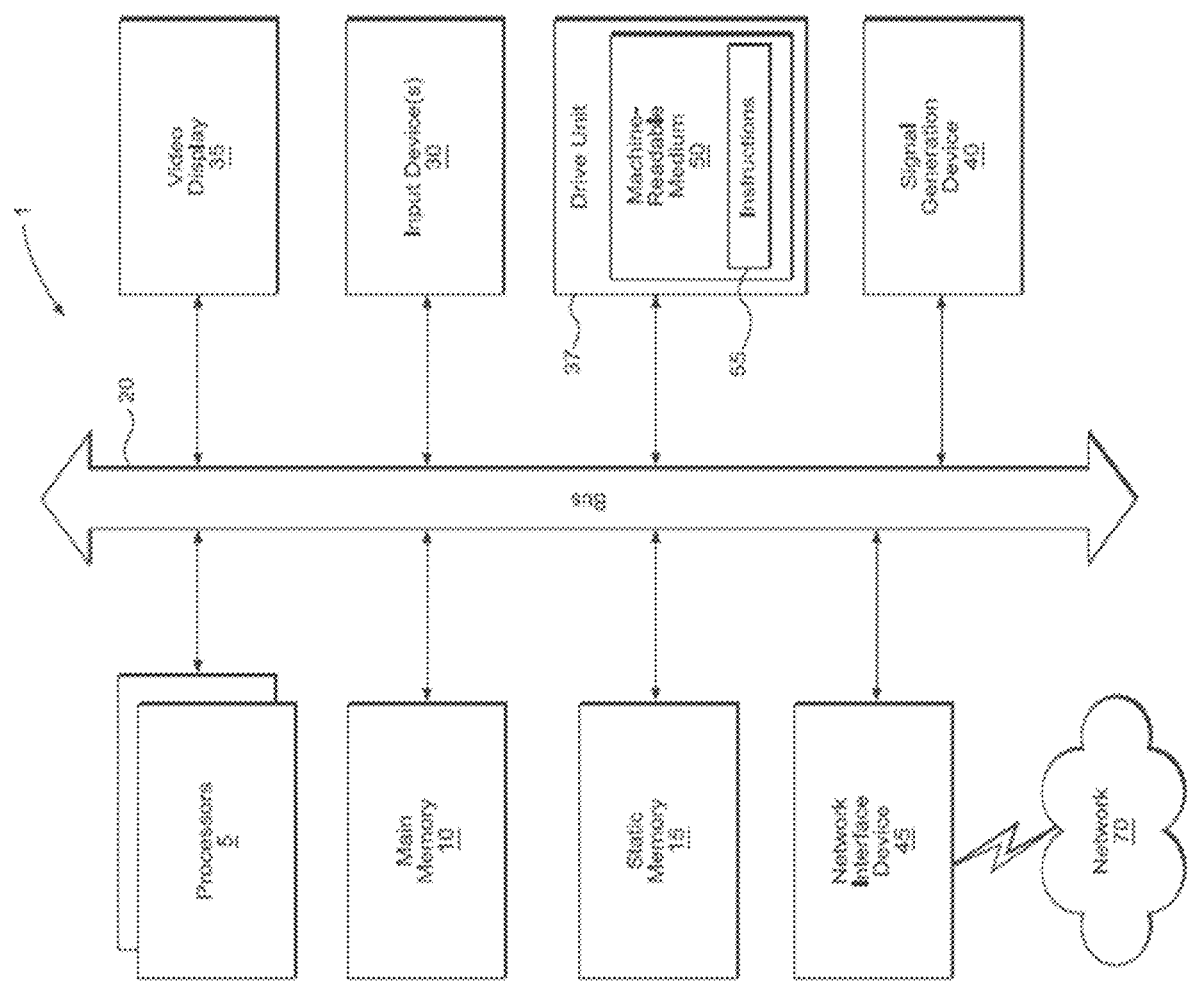

SYSTEMS AND METHODS FOR GENERATIVE BUILDING DESIGN AND MANUFACTURER INTEGRATION

CROSS-REFERENCE TO RELATED APPLICATIONS

This application claims the priority benefit of U.S. Provisional Application No. 63/719,517 filed on Nov. 12, 2024. The disclosure of this application is incorporated by reference herein, including all references and appendices cited therein, for all purposes as if fully set forth herein.

FIELD OF THE PRESENT TECHNOLOGY

The present disclosure relates generally to computer-aided design systems and more specifically to an automated computer-aided design system that integrates generative building design and manufacturing integration.

BACKGROUND

In the architecture and construction industry, there exists a fundamental technological gap between contemporary design requirements and existing computer-aided tools and processes. Modern building projects require complex optimization across multiple technical parameters, including structural performance metrics, sustainability benchmarks, regulatory compliance requirements, and cost factors. Existing computer-aided design (CAD) systems, however, rely predominantly on manual inputs and disconnected computational processes. This technological limitation is particularly evident in mass timber construction applications. Despite the increasing adoption of mass timber for its quantifiable sustainability and efficiency advantages, the core computational processes of design optimization, cost estimation, and manufacturing specification remain largely non-automated. Existing computer-aided design (CAD) systems lack artificial intelligence capabilities necessary for real-time optimization across multiple technical constraints. Specifically, current technological solutions require manual computation and verification of material selection parameters, cost projections, regulatory compliance factors, manufacturer-specific component integration, mass timber configuration specifications, and price estimation data. This technological deficiency results in measurable inefficiencies, including extended design cycles, increased computational errors, sub-optimal configuration outcomes, and imprecise cost estimations.

The technical field of computer-aided design and construction faces computational challenges in translating complex design requirements into executable construction specifications. Existing systems lack integrated capabilities for artificial intelligence-based design optimization, automated incorporation of manufacturer and supplier specifications, and comprehensive analysis of project costs, material availability, safety compliance, and sustainability metrics.

SUMMARY

This summary is provided to introduce a selection of concepts in a simplified form that are further described in the Detailed Description below. This summary is not intended to identify key features or essential features of the claimed subject matter, nor is it intended to be used as an aid in determining the scope of the claimed subject matter.

Embodiments of the present disclosure provide systems, methods, and non-transitory computer-readable storage media for implementing computer-aided automated building design and procurement processes for construction projects, representing a significant advancement in CAD technology through the integration of artificial intelligence, real-time modeling, and automated documentation generation to streamline the building design and procurement process.

The present disclosure provides unprecedented technological improvements in the field of computer-aided building design through its novel implementation of real-time end-to-end automation. Unlike conventional systems that require weeks or months of manual processes and human intervention between initial design and procurement stages, the present disclosure's integrated computational architecture enables complete transformation of user inputs into manufacturer-ready documentation within minutes. This represents a dramatic and unexpected improvement in processing speed that was previously considered impossible in the building design industry.

The system achieves this remarkable processing speed through several novel technical features working in concert. First, the system employs a sophisticated sequential processing architecture with four interconnected functional modules—Generate, Populate, Simulate, and Publish. Each module's output seamlessly feeds into the next stage of processing, eliminating the traditional delays and manual interventions required between stages in conventional systems. Second, the system implements novel data streaming protocols that enable instantaneous bi-directional communication between internal processing modules and external manufacturer databases. This eliminates the traditional lag time between design iterations and manufacturer feedback. Third, the system employs machine learning algorithms that dynamically convert simulation outputs into manufacturer-specific documentation formats in real-time, automatically adjusting terminology, units, and specifications to match each manufacturer's established templates and requirements.

The disclosure represents a significant advancement in building design technology through specific technical improvements to computer functionality. The system's novel integrated sequential architecture and real-time data integration protocols directly address and solve the longstanding technical problem of processing inefficiencies in building design automation.

Rather than merely digitizing manual processes, the disclosure's computational architecture introduces fundamental technical improvements that enable previously impossible processing speeds. The system performs complex data transformations through its specialized computational framework, converting raw input parameters into sophisticated three-dimensional models and then into manufacturer-specific documentation. This transformation process implements novel technical solutions that revolutionize the speed and accuracy of building design automation.

The disclosure specifically addresses critical technical challenges in computer-aided design systems through its novel integrated sequential processing architecture, real-time data integration protocols, and intelligent template generation systems. These improvements result in tangible technical benefits including: dramatic reduction in processing time from weeks to minutes, enhanced accuracy through automated data transformation, improved computational efficiency through seamless module integration, real-world practical applications in building design and procurement.

According to some embodiments, an example system for automated building design includes at least one processor and memory storing instructions such that when executed, these instructions cause the system to: receive, during a single active design session, a plurality of building design parameters via at least one input interface; generate, during the single active design session, a three-dimensional computational building model based on the received building design parameters; integrate, during the single active design session, generic and manufacturer-specific components and assemblies within the three-dimensional computational building model; execute, during the single active design session, at least one computational simulation on the integrated three-dimensional computational model; automatically generate, during the single active design session, a plurality of electronic documentation outputs based on results of the at least one computational simulation; automatically transmit, during the single active design session, the generated electronic documentation outputs to external systems of contractors for RFP documents, manufacturers for RFQ documents, and regulatory authorities for compliance verification documents; and receive one or more electronic responses corresponding to the automatically transmitted RFP, RFQ and regulatory compliance verification documents via the at least one communication interface.

According to some embodiments, an example method for automated building design involves receiving building design parameters comprises receiving, during a single active design session, a plurality of building design parameters via at least one input interface; generating, during the single active design session, a three-dimensional computational building model based on the received building design parameters; integrating, during the single active design session, generic and manufacturer-specific components and assemblies within the three-dimensional computational building model; executing, during the single active design session, at least one computational simulation on the integrated three-dimensional computational model; automatically generating, during the single active design session, a plurality of electronic documentation outputs based on results of the at least one computational simulation; automatically transmitting, during the single active design session, the generated electronic documentation outputs to external systems of contractors for RFP documents, manufacturers for RFQ documents, and regulatory authorities for compliance verification documents; and automatically receiving, while the user remains in the single active design session, one or more electronic responses corresponding to the automatically transmitted RFP, RFQ and regulatory compliance verification documents via the at least one communication interface.

According to some embodiments, a computer program product is described that can include a computer-readable storage device, such as a non-transitory computer-readable storage medium, that includes instructions that, when executed by the at least one processor, cause the at least one processor to perform operations to: receive, during a single active design session, a plurality of building design parameters via at least one input interface; generate, during the single active design session, a three-dimensional computational building model based on the received building design parameters; integrate, during the single active design session, generic and manufacturer-specific components and assemblies within the three-dimensional computational building model; execute, during the single active design session, at least one computational simulation on the integrated three-dimensional computational model; automatically generate, during the single active design session, a plurality of electronic documentation outputs based on results of the at least one computational simulation; automatically transmit, during the single active design session, the generated electronic documentation outputs to external systems of contractors for RFP documents, manufacturers for RFQ documents, and regulatory authorities for compliance verification documents; and receive one or more electronic responses corresponding to the automatically transmitted RFP, RFQ and regulatory compliance verification documents via the at least one communication interface.

In some embodiments, the computer-aided design system integrates computational design algorithms, machine learning models, and manufacturer-specific product databases within a computer-aided design (CAD) environment to execute manufacturer integrated design and procurement workflows, while implementing computational feedback loops for iterative design refinement.

According to an aspect of the present disclosure, the computer-aided design system may implement specialized machine learning models configured to execute multiple computational functions, including: (1) material sourcing parameter optimization, (2) real-time performance metric calculation, (3) automated regulatory compliance verification, and (4) execution of cost optimization algorithms throughout the design iteration process.

In some embodiments, the computer-aided design system may execute automated negotiation protocols between internal optimization algorithms and external procurement systems, enabling automated collection and analysis of material cost data for real-time design optimization.

In some embodiments, the integration of computational optimization within the Computer-aided design system implements an automated workflow that manages documentation exchange between stakeholders.

According to some embodiments, the computer-aided design system may operate as a comprehensive design, development, and operating platform that is applicable to various building types, including residential, commercial, and mixed-use.

Other example embodiments of the disclosure and aspects will become apparent from the following description taken in conjunction with the following drawings.

BRIEF DESCRIPTION OF DRAWINGS

Certain embodiments of the present technology are illustrated by the accompanying figures. It will be understood that the figures are not necessarily to scale and that details not necessary for an understanding of the technology or that render other details difficult to perceive may be omitted. It will be understood that the technology is not necessarily limited to the particular embodiments illustrated herein.

FIG. 9 is a simplified block diagram of an exemplary system that is used to implement embodiments according to the present technology.

DETAILED DESCRIPTION

Figure 1:
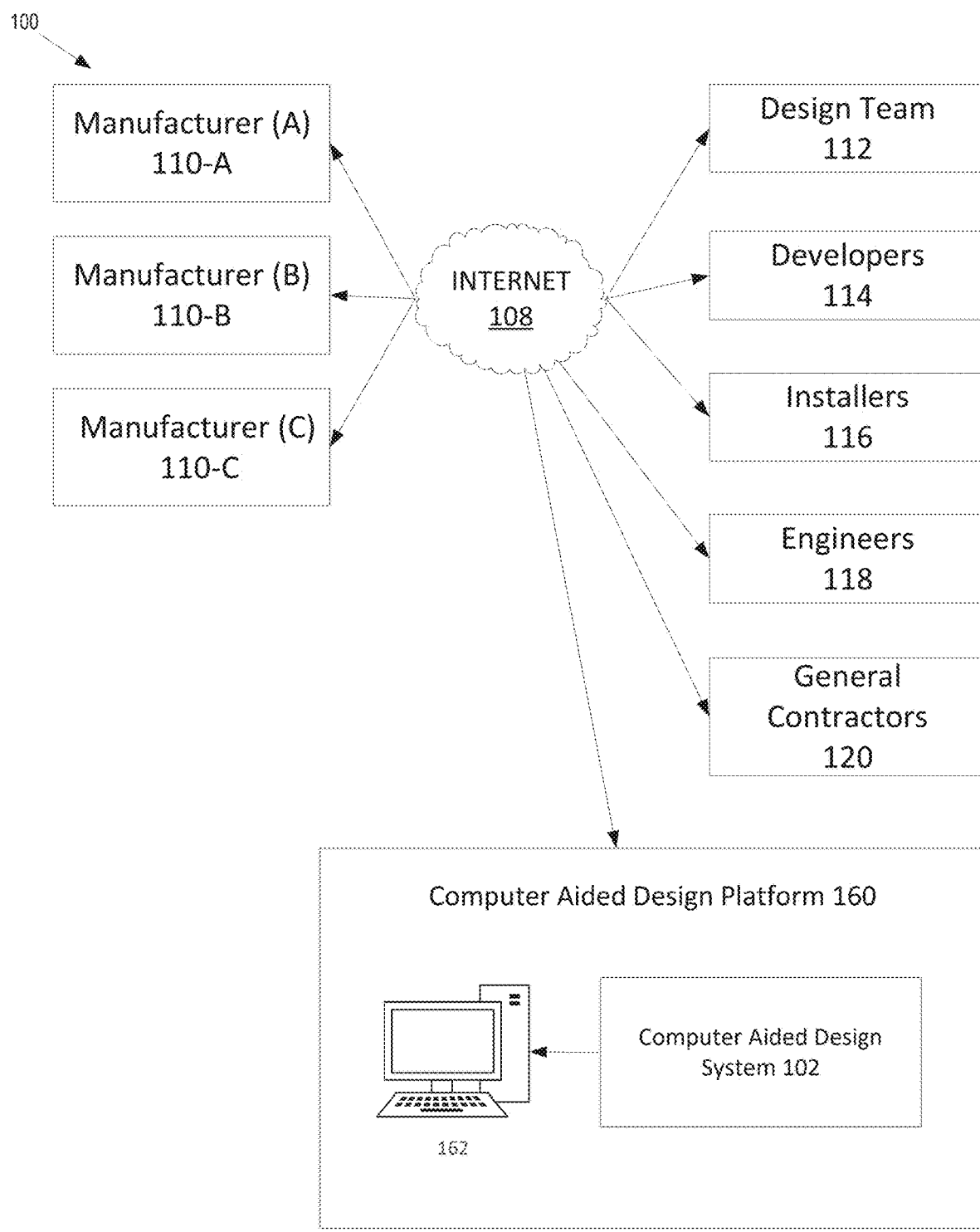
FIG. 1 is a schematic block diagram of a general system architecture of a system that performs computer-aided automated building design and procurement for a construction project, according to one example embodiment.

The following detailed description includes references to the accompanying drawings, which form a part of the detailed description. The drawings show illustrations in accordance with example embodiments. These example embodiments, which are also referred to herein as "examples," are described in enough detail to enable those skilled in the art to practice the present subject matter. The embodiments can be combined, other embodiments can be utilized, or structural, logical, and electrical changes can be made without departing from the scope of what is claimed. The following detailed description is therefore not to be taken in a limiting sense, and the scope is defined by the appended claims and their equivalents.

Overview

The present disclosure describes systems, methods, and non-transitory computer-readable storage media for automating building design and manufacturer integration. The system combines three key components: AI/machine learning algorithms for real-time decision-making in building design and manufacturer integration, advanced design software for generating multiple design options, and direct integration with manufacturer product databases. The present disclosure addresses a common construction industry challenge where design, material selection, pricing, and regulatory compliance typically exist as separate manual processes, leading to time inefficiencies and potential errors. The system automates and integrates these processes into a unified workflow.

Example embodiments provide a system that uses defined rules and input parameters to automatically generate building framework designs. For each generated framework, the system automatically queries both internal databases and external manufacturer systems to identify and incorporate suitable components and assemblies into the framework design. The system then runs computational simulations on the component-populated framework to verify pre-established objectives have been met, such as, for example, sustainability and cost-efficiency. The system runs these same computational simulations for compliance with sustainability metrics, certification requirements, and structural load combinations, as well as specific parameters such as, for example, building dimensions, environmental factors, building codes, zoning requirements, cost limits, sustainability requirements, and structural engineering specifications. Where simulations identify non-compliant or suboptimal designs, the system automatically executes new simulations using alternative components and assemblies until reaching compliant solutions. This computational approach enables systematic exploration of design options while ensuring all solutions meet the required specifications.

The present disclosure describes systems, methods, and non-transitory computer-readable storage media for automating building design and procurement assisted by AI assisted computational design algorithms. The system uses defined rules and input parameters to automatically generate building framework designs. For each generated framework, the system automatically queries both internal databases and external manufacturer systems to identify and incorporate suitable components and assemblies. The system then runs computational simulations on the component-populated framework to verify that pre-established objectives have been met, including sustainability and cost-efficiency targets. These simulations also verify compliance with sustainability metrics, certification requirements, and structural load combinations, while accounting for specific parameters such as building dimensions, environmental factors, building codes, zoning requirements, cost limits, sustainability requirements, and structural engineering specifications. When simulations identify non-compliant or suboptimal designs, the system automatically iterates through alternative components and assemblies until it reaches compliant solutions. This computational approach enables systematic exploration of design options while ensuring all solutions meet the required specifications.

The system advantageously integrates design, engineering analysis, and procurement into a single automated workflow. This novel integration enables simultaneous optimization of multiple factors including costs, performance requirements, regulatory compliance, and sustainability metrics. Upon validation of a design solution, the system automatically generates and transmits requests for quotations (RFQs) and requests for proposals (RFP documents) to relevant manufacturers and suppliers. The system allows users to execute these complex processes through a unified computational platform.

The system further implements machine learning algorithms to optimize the design process and component selection. These computational tools automate design iterations, analyze decisions, detect potential errors, and facilitate collaboration between project stakeholders. When design modifications are required, the system automatically updates component selections and specifications while maintaining compliance with project requirements.

The present application offers several technical advantages over conventional Computer-aided design systems. One advantage is directed to real-time integration and processing, whereby the system enables unprecedented speed and efficiency in building design by performing complex operations in real-time, including model generation, product integration, simulation, and document generation. This real-time processing capability significantly reduces the traditional design cycle time and enables rapid iteration of design alternatives.

Another advantage is directed to intelligent product selection and integration, whereby the system's artificial intelligence components dynamically interface with both internal product libraries and external AI agents and data sources to identify and integrate manufacturer-specific products into the building frame three-dimensional computer building model. This dual-source capability ensures comprehensive product coverage while maintaining data currency and accuracy. In other words, the system is capable of maintaining accurate, current product data by combining a stable internal library for reliable baseline options and live manufacturer data for newer products and specifications and products which are not available in the internal library.

A further advantage is related to automated compliance verification, whereby the system incorporates sophisticated real-time simulation capabilities that automatically verify compliance with multiple criteria simultaneously. The system achieves this by running parallel verification processes that check: (a) regulatory requirements and building codes by comparing model parameters against stored regulatory databases, (b) engineering specifications and load requirements by performing structural calculations on components and assemblies while validating manufacturer specifications, and (c) cost parameters and budget constraints by analyzing component and assembly costs. When any verification check fails, the system identifies non-compliant elements, suggests alternative components that would achieve compliance, and can automatically re-run verifications with substitute components. This process of automated verification significantly reduces the risk of human error and ensures consistent compliance across all design iterations.

A still further advantage relates to dynamic document generation, whereby the system features automated, real-time generation of critical documentation, including: Requests for Proposals (RFP documents) for contractors, Requests for Quotations (RFQs) for vendors, and Regulatory compliance documentation. This automation ensures consistency across all documentation while significantly reducing administrative overhead.

Another advantage is related to iterative optimization capability, whereby the computer-aided design system enables unlimited iteration and optimization through an adaptive selection process. If the initially selected building components don't meet the design requirements, the system automatically iterates by selecting and testing different combinations of parts until a suitable solution is found. This process is facilitated through: real-time product substitution, dynamic mixing and matching of manufacturer products, immediate feedback on design changes, and automated re-verification of compliance requirements.

The present embodiments are, therefore, to be considered in all respects as illustrative and not restrictive, and all changes coming within the meaning and equivalency range of the appended claims are intended to be embraced therein.

Other example embodiments of the disclosure and aspects will become apparent from the following description taken in conjunction with the following drawings.

Example Embodiments

Turning now to the drawings, FIG. 1 illustrates an exemplary network architecture for implementing aspects of the present disclosure. The architecture 100 includes a Computer-Aided Design (CAD) Platform 160 comprising a Computer-Aided Design (CAD) System 102 and a user interface device 162. The CAD platform 160 communicates via a network, such as the Internet 108, with multiple manufacturers (110-A, 110-B, 110-C, also referred to as internet connected databases or external manufacturer databases) and project stakeholders including Design Team 112, Developers 114, Installers 116, Engineers 118, and General Contractors 120.

Figure 2:
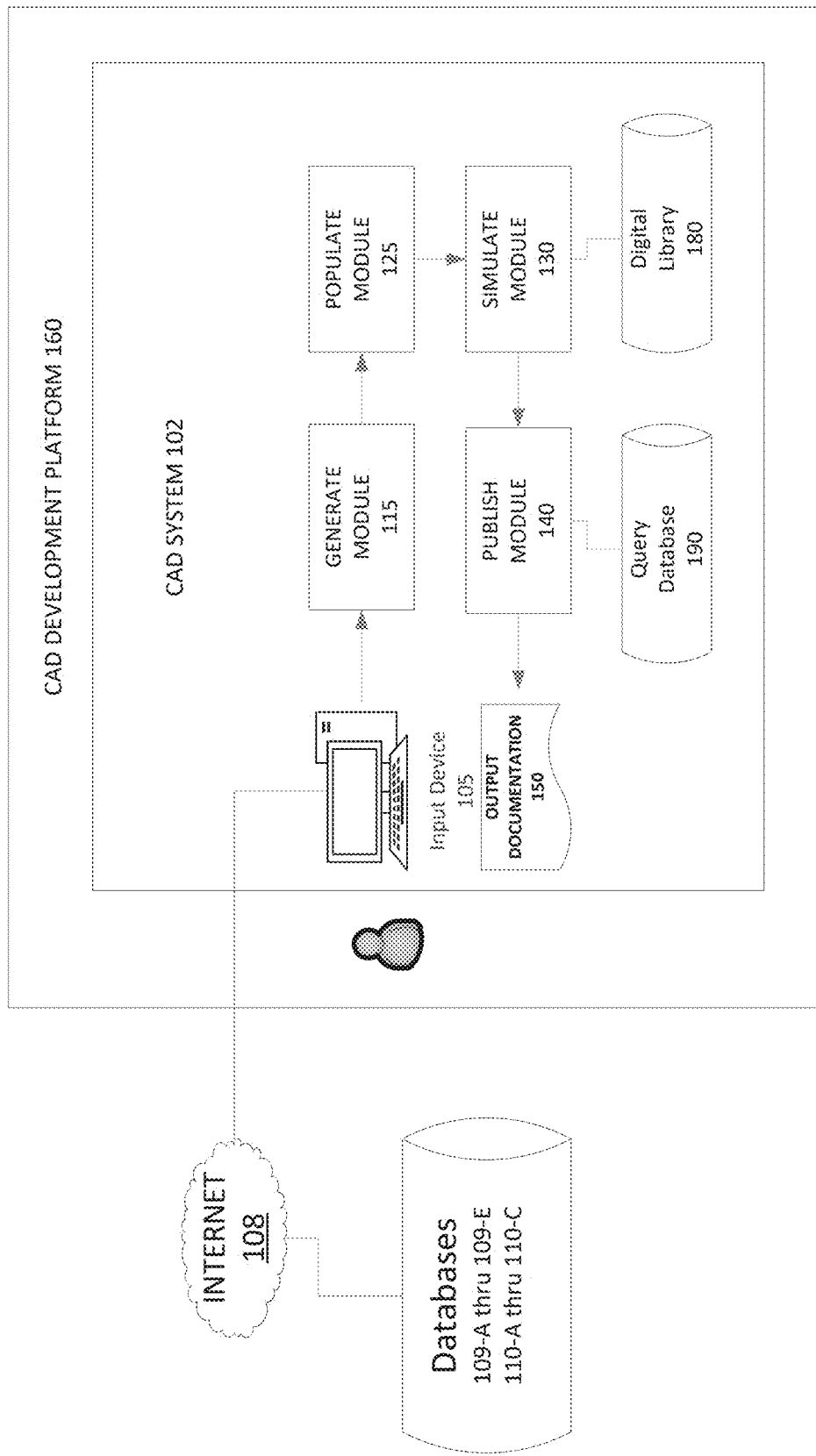
FIG. 2 illustrates a more detailed block diagram of the system of FIG. 1, according to one example embodiment.

FIG. 2 illustrates a schematic block diagram of an exemplary CAD platform 160 of FIG. 1 in accordance with embodiments of the present disclosure. The CAD platform 160 includes a CAD system 102 and peripheral components including a user interface device 162 and an output documentation device 150. The CAD system 102 further comprises four interconnected functional modules that operate in sequence to enable automated building design and procurement. These modules include a Generate Module 115 for creating a three-dimensional computational building model, a Populate Module 125 for integrating components and assemblies within the three-dimensional computational building model, a Simulate Module 130 for performing computational analyses on the integrated three-dimensional computational building model, and a Publish Module 140 for generating documentation based on the computational analyses for distribution to contractors, manufacturers and various other stakeholders.

In operation, at a top level, input may be provided to the Generate Module 115 from one or both sources: the user interface device 105 (user inputs) and the Internet 108 (e.g., Internet connected databases). The Generate Module 115 uses these inputs to create a three-dimensional computational building model. The Generate Module 115 communicates with the Populate Module 125, which integrates both generic and manufacturer-specific components and assemblies into the model. The Simulate Module 130 then processes the populated model by performing various simulations and analyses. If the simulation results are unsatisfactory, the process can iterate back to the Populate Module 125 to integrate different components and rerun the simulation until acceptable results are achieved. Once satisfactory results are obtained, the Publish Module 140 receives outputs from the Simulate Module 130 and generates required documentation through the output documentation device 150. This documentation may include, in certain embodiments, RFP documents and RFQs that can be shared with manufacturers 110 and other stakeholders through the network environment shown in FIG. 1. The various modules will be described in greater detail as follows.

Generate Module

With continued reference to FIG. 2, Generate Module 115 initiates the automated building design and material procurement process by receiving input parameters from either the user interface device 105 and/or Internet-connected databases 110-A, 110-B, 110-C. These parameters define the structural framework in a three-dimensional computer building model. The Generate Module then works with the Populate Module 125 to integrate components, allowing for iterative simulation and refinement through the Simulate Module 130 until the desired results are achieved.

Input parameters from the user-interface device 105 may include: building dimensions (height, square footage, number of stories), spatial requirements (room layouts, circulation paths, parking), material preferences (structural, finishes, mechanical, electrical & plumbing (MEP) systems), site constraints (setbacks, orientation, terrain), occupancy data (type, population density), regulatory requirements (building codes, zoning laws, accessibility standards), sustainability targets (energy efficiency, LEED certification), and budget constraints.

Input parameters from Internet-connected databases 109, 110 may comprise one or more of:

(1) Building configuration data accessed from an external configuration database 109-A storing predefined templates, wherein each template specifies standard building layouts, structural systems, dimensional parameters, floor plans, column grids, and vertical transportation systems;

(2) Site parameters retrieved from an external geographic information system (GIS) database 109-B corresponding to a specified location, wherein the site parameters comprise topographical data, property boundaries, existing utilities, soil conditions, and environmental factors affecting building design;

(3) Regulatory parameters retrieved from an external municipal records databases database 109-C, wherein the regulatory parameters comprise building code requirements and zoning regulations including maximum building height, setback requirements, floor area ratio (FAR) limits, parking requirements, and occupancy classifications;

(4) Spatial optimization parameters accessed from an external architectural standards database 109-D, wherein the spatial parameters comprise space allocations, circulation requirements, room adjacency matrices, and occupancy-based dimensional parameters;

(5) Material specification parameters retrieved from external manufacturer databases 110-A, 110-B, 110-C, wherein the material parameters comprise standardized structural elements, assembly configurations, connection details, and load-bearing specifications; and (6) Regulatory requirement parameters accessed from certification databases 109-E, wherein the performance parameters comprise structural design criteria, fire-resistance ratings, energy code compliance metrics, and accessibility standards.

Generate Module 115 processes these input parameters to generate an initial three-dimensional building framework computer model incorporating the spatial, material, and regulatory requirements defined by the parameters.

Populate Module

At the next stage of the automated building design and material procurement process, Populate Module 125 integrates building products into the three-dimensional model created by Generate Module 115. These products, which may be generic, manufacturer-specific, or a combination, are sourced from either a hierarchical digital library or manufacturer websites. The hierarchical digital library is structured to enable iterative design refinement through three levels: high-level assemblies (such as complete wall systems), intermediate assemblies (like window assemblies), and individual components (specific fasteners, panels, or fixtures). This allows users to modify and refine the design through multiple simulation cycles until achieving optimal results.

For generic building product integration, Populate Module 125 operates a real-time matching algorithm that analyzes the input parameters from Generate Module 115. This algorithm: identifies generic products and assemblies from a database that match the design parameters, displays these options through the user interface device 105, and integrates user-selected products into the three-dimensional model. This integration can be iteratively refined through multiple simulation cycles in coordination with Simulate Module 130 until optimal performance is achieved.

For manufacturer-specific products, Populate Module's 125 real-time matching algorithm queries the manufacturer database to identify products corresponding to the selected generic components. The algorithm evaluates dimensional and performance compatibility between manufacturer-specific and generic products, then generates a filtered set of compatible options. These can be integrated into the model and tested through multiple simulation iterations via Simulate Module 130 until optimal performance is achieved.

In certain embodiments, Populate Module 125 may use AI sourcing agents as support tools during its integration process. While the Populate Module 125 handles the core integration of building products into the three-dimensional model, these AI agents assist by dynamically analyzing design requirements, availability, and cost parameters. The agents, trained on manufacturer data and design guides, support the Populate Module's 125 optimization process through iterative simulations. They establish direct communication with external manufacturer databases to retrieve real-time pricing and availability data for materials meeting specified performance criteria, enhancing the Populate Module's 125 material selection and procurement capabilities within the iterative design workflow.

Real-Time Compatibility Verification

In some embodiments, the Populate Module 125 may additionally implement real-time compatibility verification between user selected assemblies and components during the populate phase. When a user selects an assembly for integration into the three-dimensional computer building model and subsequently selects another component, the system automatically executes a compatibility analysis algorithm. This algorithm compares the dimensional, material, and performance specifications of both the assembly and the selected component against a comprehensive compatibility database. Upon detecting any incompatibility between the assembly and component, the system immediately generates and displays a real-time notification through the user interface device, specifically identifying the nature of the incompatibility.

The compatibility analysis algorithm evaluates multiple parameters including: (1) physical interface specifications between the assembly and component; (2) material composition compatibility; (3) load-bearing requirements and structural integrity; (4) installation clearance requirements; (5) performance ratings and certification requirements; and (6) manufacturer-specified integration constraints.

When an incompatibility is detected, the system automatically queries both internal and external databases to identify alternative components that would maintain compatibility with the selected assembly while meeting the original design parameters. These alternative options are presented to the user through the user interface device in real-time, enabling immediate design refinement without disrupting the workflow. The system maintains a continuous record of compatibility checks and resolutions, which is subsequently incorporated into the documentation generated by the Publish Module.

Simulate Module

At the next stage, Simulate Module 130 performs one or more computational simulations on the integrated model in real time. The core simulation is a structural engineering validation study, including static and dynamic load analyses that evaluate each structural member individually, rather than using the prior art's sampling approach. In some embodiments, the engineering validation may also encompass material properties, foundation stability, frame stability and deflection, serviceability analysis (including inter-story drift and deflection), and comprehensive risk assessment including reliability analysis and critical member definition.

The Simulate Module 130 can re-run simulations within the same design session using different manufacturer-specific components, working iteratively with Populate Module 125 for design refinement. Each iteration optimizes the model based on structural analysis of stress points requiring remediation, current market cost calculations, energy performance metrics indicating efficiency improvements, and compliance status highlighting required design modifications. This iterative process allows for dynamic design refinement as new data and simulation results become available.

The Simulate Module 130 module executes four primary simulation categories: structural simulations analyzing building integrity under variable loads (including wind loads, seismic forces, material stress distributions, foundation settlement patterns, and dynamic load responses); environmental simulations evaluating performance metrics (such as energy efficiency, thermal transfer, carbon footprint, daylight penetration, and ventilation patterns); cost simulations analyzing various expenses using Populate Module data (including materials, labor, maintenance, operations, and equipment replacement); and regulatory simulations verifying compliance with local, regional, and international building codes, construction standards, safety requirements, accessibility regulations, and energy conservation mandates. During these simulations, the Simulate Module 130 continuously receives external data feeds including current material pricing and availability from manufacturer databases, labor rates and construction schedules from contractor databases, energy costs and consumption patterns from utility providers, and regulatory updates from building code databases, ensuring all analyses reflect current market conditions and requirements.

Space Planning Optimization Simulations

In some embodiments, the Simulate Module 130 may additionally perform space planning optimization simulations to maximize space utilization efficiency. These simulations evaluate multiple space planning metrics including occupancy density by analysing square footage allocations per person across offices, open workspaces, and meeting rooms to ensure compliance with space standards. The simulation also verifies circulation requirements by checking that walkways meet minimum width requirements and maintain appropriate proportions of floor area, ensuring efficient movement and emergency egress.

When space planning targets cannot be met within current design parameters, the simulate module 130 automatically identifies specific constraints preventing target achievement and generates alternative space planning configurations that better align with targets. The system then evaluates the impact on other performance metrics including structural integrity, environmental performance, and cost implications before proposing design modifications to resolve conflicts between space planning goals and other requirements.

During the simulation process, the simulate module 130 monitors how efficiently space is being used. It tracks measurements like the amount of usable space per person, how much of the building can actually be used versus its total size, and how well different departments are placed near each other. The system uses these measurements to continuously adjust and improve the space layout.

The space planning optimization results are integrated into the documentation generated by the Publish Module 140, including detailed space utilization reports that compare achieved metrics against targets and industry benchmarks. These reports provide comprehensive analysis of space utilization efficiency, highlighting areas where design targets have been successfully met while also identifying opportunities for further optimization in future design iterations. This integration ensures that space planning considerations are fully documented and communicated to all project stakeholders alongside other critical design parameters.

Life Safety Simulations

In some embodiments, the Simulate Module 130 may additionally perform comprehensive life safety simulations to optimize emergency egress and ensure compliance with fire and safety regulations. These simulations analyze occupant evacuation scenarios by modeling pedestrian flow rates, travel distances to exits, and queue formation at critical points such as stairwells and emergency exits. The system evaluates multiple evacuation routes simultaneously while accounting for varying occupant mobility and density levels throughout the building.

During life safety simulations, the simulate module 130 evaluates critical safety parameters including smoke propagation patterns, fire barrier effectiveness, and emergency response access routes. The simulation integrates with the building's spatial configuration to verify that fire-rated separations, smoke barriers, and areas of refuge meet regulatory requirements. When analyzing emergency egress paths, the system calculates maximum travel distances, identifies potential bottlenecks, and ensures adequate exit capacity based on occupant load calculations.

The simulate module 130 may automatically adjust design elements to optimize life safety performance when simulations identify deficiencies. These adjustments may include relocating exits, modifying corridor widths, reconfiguring stairwell placement, or adjusting occupancy distributions. For each adjustment, the system verifies that changes maintain compliance with other design requirements while improving overall evacuation efficiency. The simulation also evaluates the placement and coverage of life safety systems including fire suppression equipment, emergency lighting, and alarm notification devices.

Life safety simulation results are continuously monitored against established performance metrics including maximum evacuation times, exit route redundancy, and emergency response accessibility. The simulate module 130 generates detailed reports documenting compliance with life safety codes, identifying areas requiring additional safety measures, and providing recommendations for enhanced emergency preparedness. These reports integrate with the documentation package produced by the Publish Module 140, ensuring that life safety considerations are properly communicated to all project stakeholders.

Specialized Routing Optimizations

The Simulate Module 130 additionally performs specialized routing optimizations for mechanical, electrical, and plumbing (MEP) systems to ensure efficient distribution while minimizing conflicts and maximizing accessibility for maintenance. The system analyzes potential routing paths by considering structural constraints, required clearances, service access requirements, and system performance parameters. These simulations account for gravity-dependent flows in plumbing systems, pressure drops in mechanical distribution, and voltage drops in electrical circuits.

During MEP routing optimization, in one embodiment, the simulate module 130 may create a three-dimensional conflict detection model that identifies spatial clashes between different building systems. When conflicts are detected, the simulate module 130 automatically generates alternative routing solutions that maintain required separations between systems while optimizing for factors such as material usage, installation efficiency, and maintenance access. The simulation evaluates vertical shaft placement and sizing to ensure adequate space for main distribution risers while minimizing impact on usable floor area.

The simulate module 130 may further incorporate load-based sizing calculations into the routing optimization process. Load-based sizing calculations determine how big MEP system components need to be based on how much they'll be used. For example, ducts and pipes are sized based on how much heating/cooling or water needs to flow through them to serve the number of people and equipment in each area. Similarly, electrical conduits are sized based on how much power the equipment and lights will need. The system uses these calculations to make sure all MEP routes are large enough to work properly while not being wastefully oversized. For mechanical systems, it analyzes duct and pipe sizes based on flow requirements, validates pressure drop calculations, and ensures adequate sizing for peak loads. Electrical routing optimization includes cable tray and conduit sizing based on circuit quantities, required separations between power and data systems, and provision for future capacity. Plumbing route optimization accounts for slope requirements, venting needs, and fixture unit loads while maintaining efficient stack placement.

When the initial routing solutions do not meet performance criteria, the system executes automated refinement cycles. These refinements may include adjusting route paths, resizing distribution elements, relocating vertical shafts, or modifying equipment locations. Each refinement cycle verifies that changes maintain compliance with applicable codes while improving overall system efficiency. The simulation also evaluates maintenance accessibility by confirming adequate clearance space around equipment, valves, and other serviceable components.

The MEP routing optimization results are incorporated into the system's coordination documentation, including detailed sections showing resolved conflicts and maintenance access zones. The system generates reports detailing routing efficiency metrics, identifying areas requiring special coordination, and documenting compliance with separation requirements and code clearances. This documentation is integrated into the comprehensive package produced by the Publish Module 140, facilitating coordination among MEP trades during construction.

Publish Module

The Publish Module 140 generates and distributes documentation based on the final optimized simulation results from Simulate Module's 130 iterative analysis process. The Publish module 140 creates standardized documentation packages including regulatory compliance documents, RFP documents, and RFQs, which incorporate detailed specifications derived from the successful simulation iterations. These documents are securely transmitted to contractors, vendors, and regulatory bodies through established communication channels.

The Publish Module 140 may be configured to implement an automated response management system that receives and processes incoming contractor proposals and vendor quotations through standardized digital interfaces. This response and management system performs a number of functions including conducting systematic comparative analyses of submissions according to predefined evaluation criteria within the CAD system 102, considering factors such as cost, timeline, material availability, and contractor qualifications. The comparative analysis capabilities enable stakeholders to make informed decisions based on the comprehensive data generated through the design optimization process, ensuring that the final construction aligns with the validated simulations and meets all specified requirements. This systematic approach streamlines the traditionally complex procurement process by maintaining consistency between the optimized design and the final construction documentation.

In some embodiments, the Publish Module 140 may implement an advanced AI-driven bid analysis system that enhances the automated response management system.

This AI-driven system employs specialized machine learning agents to process, analyze, and harmonize incoming contractor proposals and vendor quotations. The system performs automated bid harmonization through multi-dimensional analysis of incoming bids, standardizing varied bid formats into a unified data structure for consistent comparison. During this process, the AI agents normalize cost structures across different bidding methodologies, extract and categorize key performance indicators from submission documents, identify hidden costs and potential cost escalation factors within bid terms, and evaluate schedule implications and resource allocation proposals.

The AI-enhanced system implements a sophisticated comparison framework through an intelligent comparison engine that generates weighted scoring matrices based on project priorities. This engine performs quantitative analysis of bid components including direct and indirect costs, timeline commitments, resource allocation efficiency, quality assurance measures, and risk mitigation strategies. In some embodiments, the system may simultaneously evaluate qualitative factors such as past performance metrics, technical expertise alignment, innovation in proposed solutions, and sustainability commitments. This comprehensive analysis ensures that all aspects of each bid are thoroughly evaluated against project requirements and objectives.

The AI agents conduct comprehensive risk assessment by analyzing historical performance data of bidders, evaluating financial stability indicators, assessing resource availability and capacity, identifying potential schedule conflicts, and analyzing market conditions that could impact delivery. This risk assessment process provides stakeholders with a detailed understanding of potential challenges and mitigation strategies associated with each bid submission. In an embodiment, the AI-enhanced system may then generate optimization recommendations through automated analysis, identifying areas for potential cost reduction, suggesting scope refinement opportunities, proposing alternative approaches to achieve project objectives, and highlighting opportunities for value engineering.

In some embodiments, to facilitate stakeholder collaboration, the AI-enhanced system generates customized comparison reports for different stakeholder groups and provides real-time updates on bid analysis status. The system enables collaborative decision-making through shared analytics dashboards while maintaining audit trails of all analyses and decisions. Additionally, it facilitates direct communication channels for bid clarification when needed. Throughout this process, the system maintains secure communication protocols and ensures data privacy while enabling efficient collaboration between all project stakeholders. This AI-driven approach significantly reduces the time required for bid analysis while improving the accuracy and comprehensiveness of the evaluation process, ultimately leading to more informed decision-making in the selection of contractors and vendors.

In some embodiments, the Publish Module 140 may additionally generate a data analytics package alongside standard documentation deliverables. This package includes a queryable database 190 that enables stakeholders to perform ad-hoc business intelligence analysis. The database 190 consolidates project data including cost analyses, performance metrics, material specifications, simulation results, and optimization outcomes generated during the design phase.

The database 190 supports standardized analysis capabilities, allowing stakeholders to: (1) generate cost breakdowns across design iterations; (2) create custom reports for performance metrics; (3) analyze relationships between building systems; (4) Track material selections and specifications; (5) review simulation data to understand design decisions.

The data analytics package implements role-based access controls to ensure appropriate data access for different stakeholder groups while maintaining security protocols. The system provides both standard analytical templates and custom query capabilities to support various analysis needs. This enables stakeholders to extract actionable insights from the design and optimization data, facilitating informed decision-making throughout the project lifecycle.

In some embodiments, the data analytics package may integrate with standard business intelligence tools to support ongoing project analysis throughout the building lifecycle.

In some embodiments, the Publish Module 140 may additionally accept information provided from installers, manufacturers, and General Contractors to guide the creation of Requests for Proposals (RFPs) and Requests for Quotations (RFQs). This functionality represents a significant advancement over traditional systems by enabling real-time integration of stakeholder input into the documentation generation process. The Publish module 140 may implement standardized digital interfaces that facilitate systematic collection and processing of information from these key project participants.

The Publish module's 140 ability to incorporate input from multiple stakeholder sources enhances the accuracy and relevance of the generated documentation. For instance, installer-provided information helps ensure that the RFPs and RFQs accurately reflect installation requirements and constraints, while manufacturer input contributes to precise material specifications and performance requirements. Similarly, General Contractor feedback helps shape procurement documentation to align with construction scheduling, site logistics, and project execution requirements.

Through its automated response management capabilities, the Publish module 140 processes this stakeholder information according to predefined evaluation criteria within the Computer-aided design system. This systematic approach enables the creation of comprehensive documentation packages that reflect not only the technical design requirements but also the practical insights and constraints provided by installers, manufacturers, and General Contractors. The integration of this stakeholder input helps streamline the procurement process by ensuring that RFPs and RFQs are optimized for real-world construction conditions while maintaining consistency with the validated simulations and meeting all specified requirements.

Figure 3:
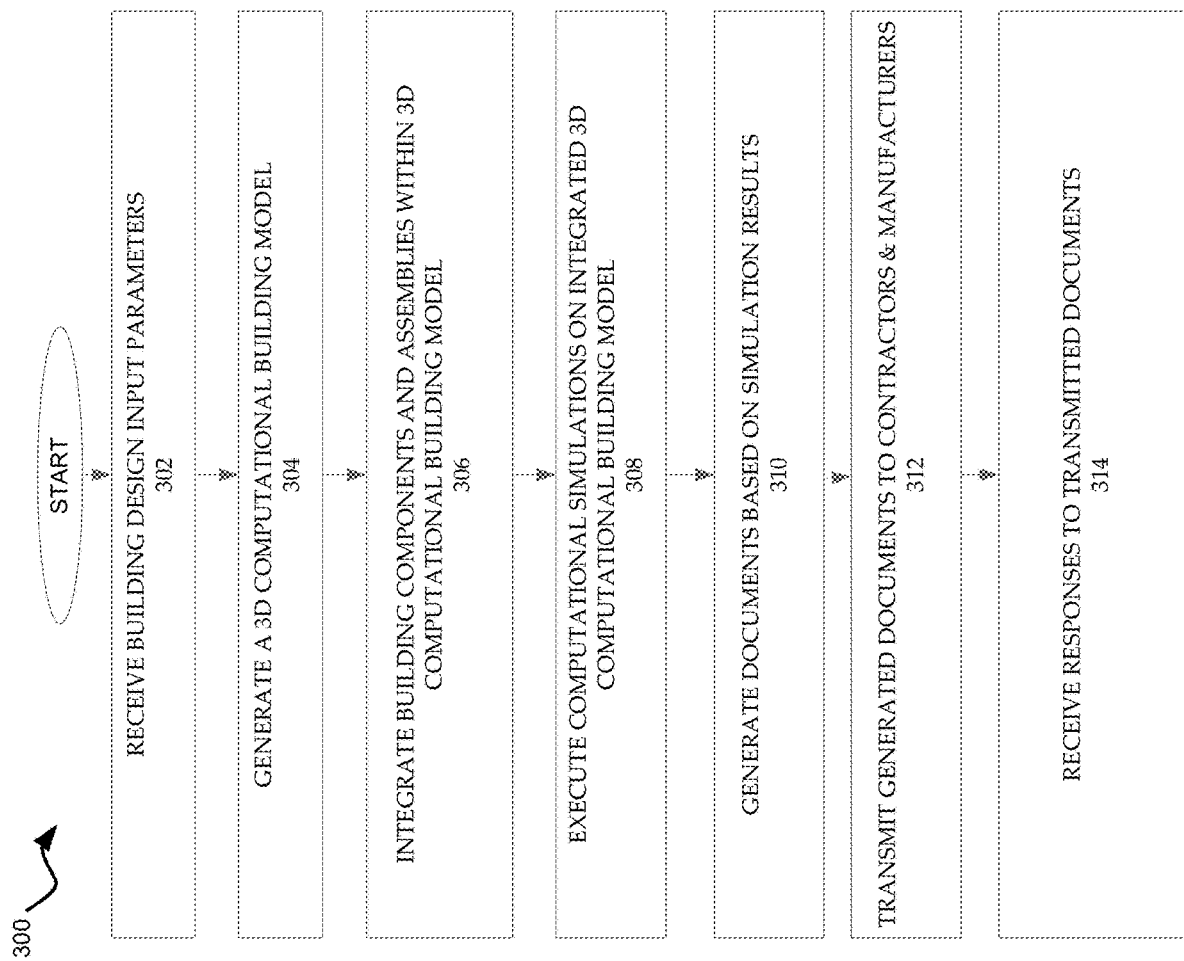
FIG. 3 is a flow diagram of an example of a method for performing computer-aided automated building design and procurement for a construction project, according to one example embodiment.

FIG. 3 is a flow diagram illustrating an example method 300 of performing generative building design and manufacturer integration in the example system architecture of FIGS. 1-2. These steps may be performed by at least one general purpose processor of a computing device or instead by at least one dedicated processor specifically suited to the functionality described herein.

Operations of method 300 recited below can be implemented in an order different than described and shown in FIG. 3. Moreover, the method 300 may have additional operations not shown herein, but which can be evident to those skilled in the art from the present disclosure. Method 300 may also have fewer operations than shown in FIG. 3 and described below.

In accordance with method 300 to be described, each step with the exception of receiving responses to the transmitted RFP documents and RFQs through the secure communication channels, are purposefully structured to be performed during a single active design session. As used herein, 'a single active design session' refers to a continuous period of time during which a user can accomplish the design-to-document transmission cycle, where all design decisions, modifications and RFP/RFQ submissions occur in real-time through direct interaction with the design system.

At step 302, the system receives input parameters at a Generate Module. In various embodiments, the input parameters may comprise at least one of: user-defined parameters, building configuration data parameters, site parameters, regulatory parameters, spatial optimization parameters, material specification parameters and performance requirement parameters. The input parameters may be received from at least one external data source operatively coupled to the system through a communication interface.

At step 304, the Generate Module is configured to utilize the input parameters received at step 302 to generate a three-dimensional computer building model. The three-dimensional computer building model comprises a digital representation of structural components and spatial relationships that define a building frame configuration.

At step 306, a Populate Module is configured to populate, in real-time, the three-dimensional computer building model with building products selected from at least one of: manufacturer-specific products and generic products. The building products may be retrieved from a digital product library comprising standardized product specifications and manufacturer-specific product data.

At step 308, a Simulate Module is configured to execute, in real-time, a plurality of simulations on the populated three-dimensional computer building model. Each simulation comprises a unique design iteration incorporating design variants of the selected building products. The Simulate Module analyzes each simulation output for: (i) compliance with applicable regulatory requirements; (ii) verification of engineering requirements including structural load calculations; and (iii) evaluation of cost considerations including material and labor costs.

At step 310, in response to completing the simulations, a Publish Module executing on the at least one processor is configured to generate a plurality of output documents. The output documents comprise: (i) requests for proposals (RFP documents) directed to contractors; (ii) requests for quotations (RFQ documents) directed to product vendors; and (iii) regulatory compliance documentation for submission to regulatory bodies. The output documents are generated according to standardized templates and protocols specific to each recipient type.

At step 312, the Publish Module executing on the at least one processor is configured to transmit the plurality of output documents to their respective recipients through secure communication channels. The RFP documents are transmitted to selected contractors, the RFQs are transmitted to qualified product vendors, and the regulatory compliance documentation is transmitted to appropriate regulatory bodies.

At step 314, the system executing on the at least one processor is configured to receive responses to the transmitted RFP documents and RFQs through the secure communication channels. The responses may comprise: contractor proposals including pricing and timeline estimates, and vendor quotations including product specifications and availability information. The received responses may be processed and analyzed by the system to facilitate comparison and selection of contractors and vendors.

Example: Commercial Building 3D Modelling
Initial Project Context

In accordance with embodiments of the present disclosure, a construction project requires designing a multi-story commercial building using selected construction materials, with objectives including sustainability and cost-efficiency.

Overview

A Process

A process is described by way of example, and not limitation, for designing a commercial building. The process starts with a Generate Module, executing on at least one processor, receiving a plurality of input parameters including, for example, building configuration data, site parameters, regulatory parameters and environmental parameters, as described below. The Generate Module utilizes the input parameters to construct a three-dimensional computational representation of a building framework comprising a multi-story commercial edifice having a specified floor area. At a next stage of the process, a populate module populates the three-dimensional computational representation of the building framework with standardized and manufacturer-specific components and assemblies. At a next stage of the process, a simulation module executes multiple analytical simulations on the populated three-dimensional computational representation of the building to generate a plurality of design variants which are evaluated against sustainability metrics and cost-efficiency metrics. A Publish Module generates output documentation comprising: (i) requests for proposals (RFP documents) directed to contractors; (ii) requests for quotations (RFQ documents) directed to product vendors; and (iii) regulatory compliance documentation for submission to regulatory bodies, wherein the output documentation is generated according to standardized templates and protocols specific to each recipient type.

A. Generate Module
Input Parameter Collection
   1. User-Defined Parameters
      a. Number of stories: a pre-determined value
      b. Total floor area: a pre-determined value
      c. Architectural aesthetic requirements
   2. Building Configuration Data
      d. Selected template: "Commercial Building Template"
      e. Pre-determined column grid spacing
      f. Core-and-shell configuration with vertical transportation
      g. Pre-determined floor-to-floor heights
   3. Site Parameters
      h. Lot dimensions: pre-determined values
      i. Soil classification
      j. Topographical characteristics
   4. Regulatory Parameters
      k. Zoning classification
      l. Maximum height restrictions
      m. Setback requirements
      n. Environmental Parameters
      o. Energy Use Intensity (EUI) target: a pre-determined value
      p. Sustainability certification requirements
      q. Carbon emissions targets
      r. Code classification
      s. Water use reduction targets
      t. Construction waste diversion requirements B. Populate Module The Populate Module receives the three-dimensional computational representation of the building generated by the Generate Module and executes a product integration process. The product integration process accesses a hierarchical digital library 180 comprising a first section containing generic building product data and a second section containing manufacturer-specific building product data. The Populate Module selectively retrieves and integrates building products from the manufacturer-specific product data section and the generic building product data section into the three-dimensional computational representation of the computer-generated model.

In various embodiments, the Populate Module is configured to receive the multi-dimensional computational representation of the building generated by the Generate Module and execute a product integration process thereon. The product integration process may access a hierarchical digital library 180, wherein the hierarchical digital library 180 comprises: (i) a first section containing generic building product data, and (ii) a second section containing manufacturer-specific building product data. The Populate Module is further configured to selectively retrieve and integrate one or more building products from at least one of: the manufacturer-specific product data section and the generic building product data section, wherein the building products are integrated into the three-dimensional computational representation of the computer-generated model.

In various embodiments, the Populate Module may comprise one or more artificial intelligence optimization algorithms configured to enhance product integration processes by executing supplier and manufacturer analysis routines. The analysis routines are configured to evaluate a plurality of potential product sources, wherein the product sources comprise manufacturers and suppliers. The evaluation is performed by comparing characteristics of the potential product sources against at least one predetermined criterion, wherein the predetermined criteria may include, but are not limited to: unit cost metrics, delivery timeline parameters, and combinations thereof.

Generic Product Integration—Populate Module
   Structural System
      i. Primary structural members
      ii. Secondary structural members
      iii. Vertical support elements
      iv. Floor system components
      v. Manufacturer-Specific Integration
   Structural Products
      vi. Steel structural members
      vii. Structural deck systems
      viii. Concrete systems
   Envelope Products
      ix. Curtain wall systems
      x. Glazing assemblies
      xi. Insulated panel systems
      xii. Roofing assemblies AI Agent Optimization—Populate Module
   Material supplier cost optimization
   Manufacturing lead time optimization
   Sustainable material sourcing optimization C. Simulate Module The Simulate Module evaluates the populated three-dimensional computational representation through multiple analytical operations performed by processors coupled to computer-readable memory. These operations can include: (i) structural load analysis routines evaluating force distributions and structural integrity; (ii) environmental performance analysis routines assessing energy efficiency and resource utilization; (iii) cost analysis routines calculating capital and operational expenditures; and (iv) compliance verification routines confirming adherence to regulatory requirements and sustainability criteria. The analytical operations may be executed sequentially, in parallel, or in any combination.
(i) Structural Simulations—Simulate Module
   Load Analysis Results
      Wind drift within pre-determined limits
      Seismic response requirements
      Foundation bearing pressure requirements
(ii) Environmental Analysis—Simulate Module
   Energy performance metrics
      Daylighting analysis
      Carbon footprint assessment
      HVAC optimization
(iii) Cost Analysis—Simulate Module
   Material cost estimation
      Labor cost projection
      Construction schedule estimation
      Lifecycle cost modeling
(iv) Compliance Verification—Simulate Module
   Fire rating requirements
   Accessibility compliance
   Energy code compliance
   Sustainability certification requirements
Publish Module The Publish Module executes a sequence of documentation generation and distribution operations based on simulation results from the Simulate Module. It generates standardized documentation including regulatory submissions and bid documents, and distributes these to contractors, vendors, and regulatory bodies through secure communication channels. The Publish Module also performs automated comparison of contractor bids, verifies vendor qualifications, tracks material substitution requests, and logs and responds to bid clarification requests.

Figure 4:
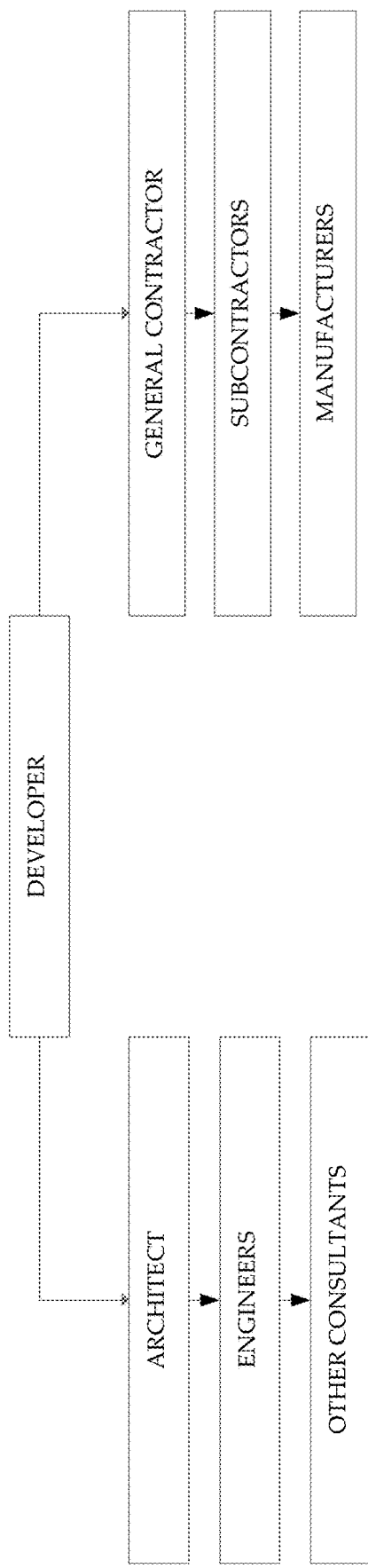
FIG. 4 illustrates a prior art hierarchical organizational structure for construction project management.
Figure 5:
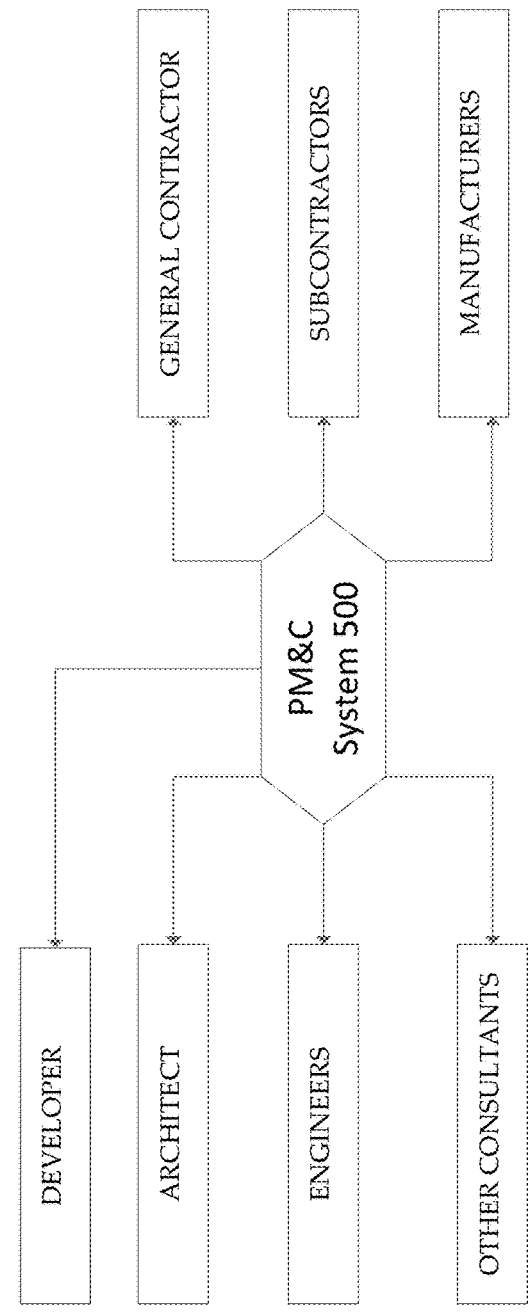
FIG. 5 illustrates an improved project management and communication (PM&C) system organizational structure, wherein a centralized PM&C System 500 interconnects all project participants.

Documentation Generated—Publish Module
   Regulatory Submissions
      Building permit documentation
      Energy code compliance documentation
      Sustainability certification documentation
      Engineering calculations
   Bid Documents
      Contractor procurement documentation
      Trade qualification requirements
      Material specifications
      Performance requirements
Distribution Protocol—Publish Module
   Documents transmitted to:
      Regulatory authorities
      Pre-qualified contractors
      Certification reviewers
      Project stakeholders
   Response Management
      Automated bid comparison
      Vendor qualification verification
      Material substitution management
      Bid clarification management FIG. 5 illustrates a centralized hub architecture of an exemplary system of the present disclosure, which represents a more efficient approach to construction project management and coordination, in contrast to the traditional fragmented approach with discontinuous workflows shown in FIG. 4. As shown in FIG. 5, the centrally located construction project management and coordination system (hereinafter PM&C system 500) enhances the developer's role by transforming traditional hierarchical communication into an efficient coordination hub. While the developer remains a key project stakeholder, PM&C system 500 serves as a critical bridge between design and construction teams, linking all participants: developers, architects, engineers on the design side, and general contractors, subcontractors, manufacturers, and other consultants on the construction side. This innovative hub-and-spoke architecture, anchored by PM&C system 500, eliminates the communication bottlenecks depicted in FIG. 4 that create delays and information gaps in conventional approaches.

The centralized architecture of FIG. 5, with PM&C system 500 at its core, enables direct, real-time access to project information for each participant, facilitating instantaneous communication between design and construction stakeholders. Unlike the fragmented approach of FIG. 4, this central hub architecture enables simultaneous collaboration through a hub-and-spoke connectivity model, with PM&C system 500 serving as the crucial interface between design development and construction execution. The interconnected pathways illustrated in FIG. 5 demonstrate the direct channels of communication and data flow between the system and each stakeholder across both design and construction phases.

The central hub architecture, implemented through PM&C system 500, provides substantial technical advantages in data consistency and version control between design and construction teams. In contrast to the sequential information transfer shown in FIG. 6, where data potentially becomes outdated or corrupted during transmission between parties, the architecture of FIG. 5 maintains a single authoritative source of data within the central PM&C system 500. This centralized approach ensures all stakeholders, whether involved in design or construction activities, have continuous access to current designs, specifications, and project updates.

The exemplary architecture implements broad, permission-based availability of project information while maintaining role-based security controls through PM&C system 500 at its hub. Rather than information being compartmentalized within separate design and construction organizations as depicted in FIG. 4, or requiring multiple sequential handoffs, the hub architecture of FIG. 5 enables direct, controlled access across the design-construction divide. This structural improvement significantly reduces transmission delays and minimizes potential information distortion that commonly occurs in traditional multi-party communication chains.

The hub model of FIG. 5, centered on PM&C system 500, works especially well for complex decision-making processes spanning design and construction phases. When changes are proposed or issues arise, the system allows immediate input from all key stakeholders without needing back-and-forth communications or multiple separate meetings between design and construction teams. All authorized stakeholders can access relevant information at the same time, provide their input, and assess how proposed changes would affect their project work, regardless of their role in design or construction. This shared access helps speed up decisions while reducing mistakes and rework.

Additionally, the centralized architecture of FIG. 5, with PM&C system 500 as its foundational element, creates a comprehensive digital record of all project-related communications, decisions, and modifications across both design and construction activities. In contrast to the distributed information storage inherent in the fragmented approach of FIG. 6, the central hub architecture of FIG. 5 consolidates and organizes all project data through PM&C system 500. This consolidation not only enhances project execution across the design-construction spectrum but also provides valuable documentation for compliance requirements, performance analysis, and future project planning.

Figure 6:
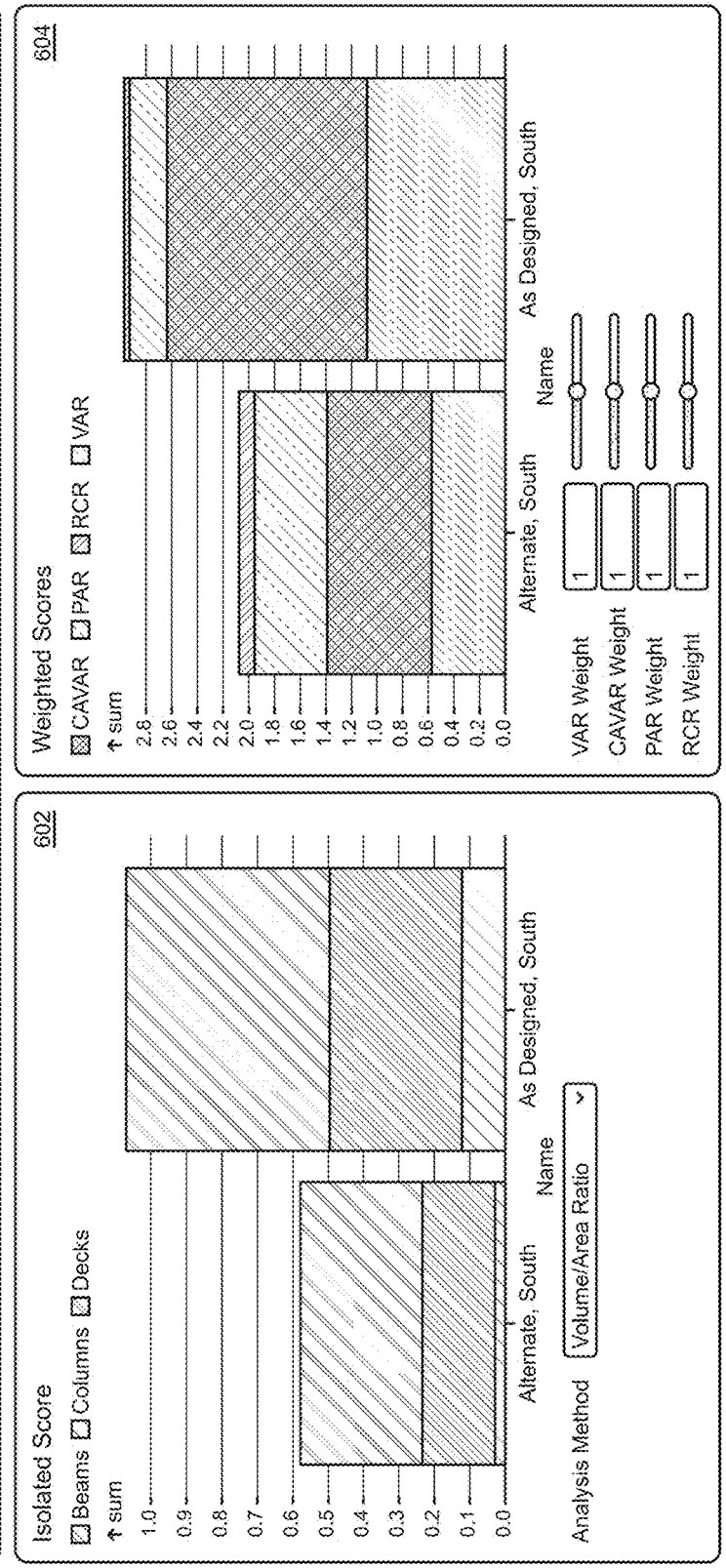
FIG. 6 illustrates an Option Analysis interface generated as an additional output of the Publish Module alongside standard documentation.

FIG. 6 illustrates an Option Analysis interface 600, which is generated as an additional output of the Publish module 140 alongside standard documentation like RFPs and RFQs. This interface facilitates comparison and optimization of structural design alternatives. The interface presents both isolated and weighted scoring mechanisms, allowing users to evaluate different design options through multiple metrics including CAVAR, PAR, RCR, and VAR, defined as follows:

VAR=the Volume/Area Ratio
    VAR measures the efficiency of a mass timber design, answering the question, 'how much fiber is needed to support this building?'. Lower values are better. The fiber volume of the elements in the building are totaled, and divided by the building's area.

CAVAR=Cost-Adjusted Volume/Area Ratio
    CAVAR measures the efficiency of a mass timber design like VAR, but doubles the volume contribution of GLT, because GLT is roughly twice as expensive as CLT. Lower values are better. The adjusted fiber volume of the elements in the building are totaled, and divided by the building's area.

PAR=Piece/Area Ratio
    PAR measures the constructability of a mass timber design, intuiting that fewer pieces are easier to assemble and take fewer crane picks. Lower values are better. The total number of elements in the building is totaled, and divided by the building's area.

RCR=Relative Complexity Ratio
    RCR measures the constructability of a mass timber design, intuiting that it is easier to assemble a building out of fewer kinds of pieces. Lower values are better. The unique elements in the building are totaled, and divided by the total number of elements.

The left panel 602 displays isolated scores for beams, columns, and decks, while the right panel 604 shows weighted scores with adjustable parameter weights. Volume data for columns 606, beams 608, and decks 610 is presented numerically at the top for both "As Designed, South" and "Alternate, South" options. This analytical tool forms a crucial part of a database architecture 190, providing a transparent record of the decision-making processes and enabling stakeholders to understand the quantitative basis for design choices through the project lifecycle.

Figure 7:
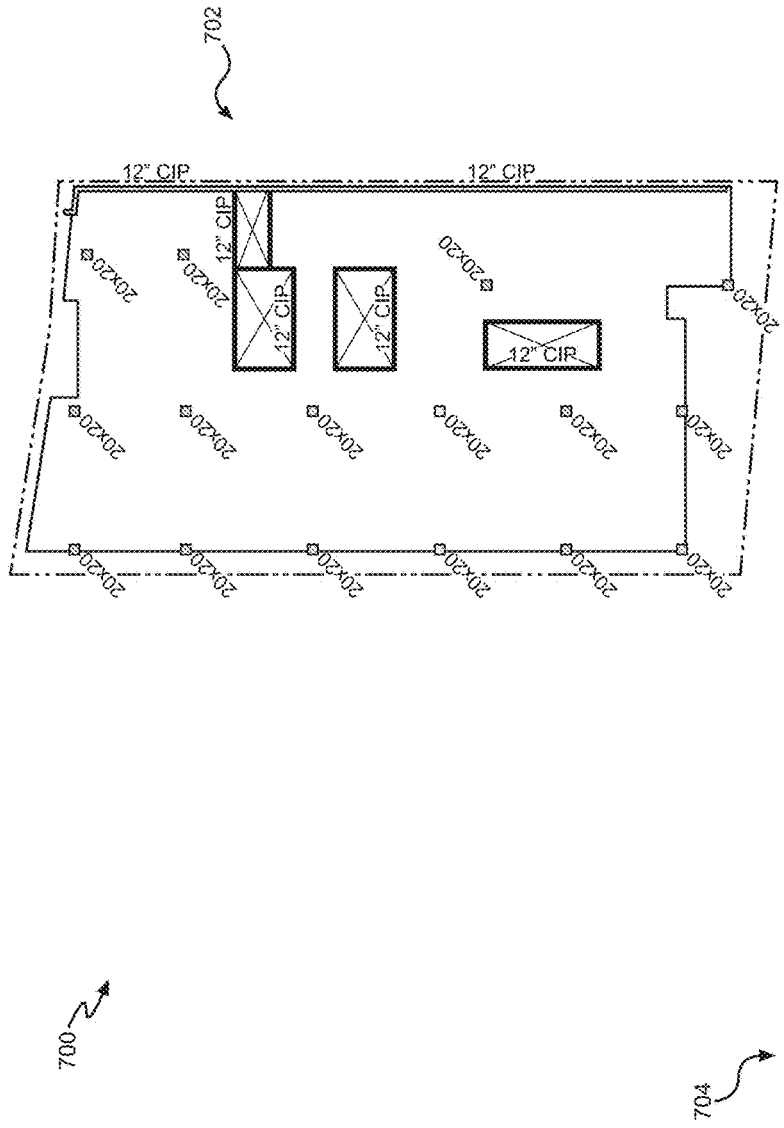
FIGS. 7 & 8 illustrate different versions of exemplary specialized output formats presented by the Publish Module.

FIG. 7 depicts an exemplary specialized output format 700, which is generated as an additional output of the Publish module 140 alongside standard documentation like RFPs and RFQs. This exemplary specialized format 700 illustrates building specifications tailored specifically for each manufacturer's requirements. As shown by way of example only, FIG. 7 combines a floor plan view 702 showing layout and openings with a detailed data table 704 specifying wall components. The data table 704 presents critical information including role assignments, product specifications (Cast-in-Place Concrete Wall), variants (12" CIP), manufacturer details, and precise quantities. In general, the specialized output format for manufacturers serves as both a comprehensive design record and a standardized documentation format for stakeholder communication, accommodating manufacturers by presenting the output data in a format compatible with their everyday workflow systems.

Figure 8:
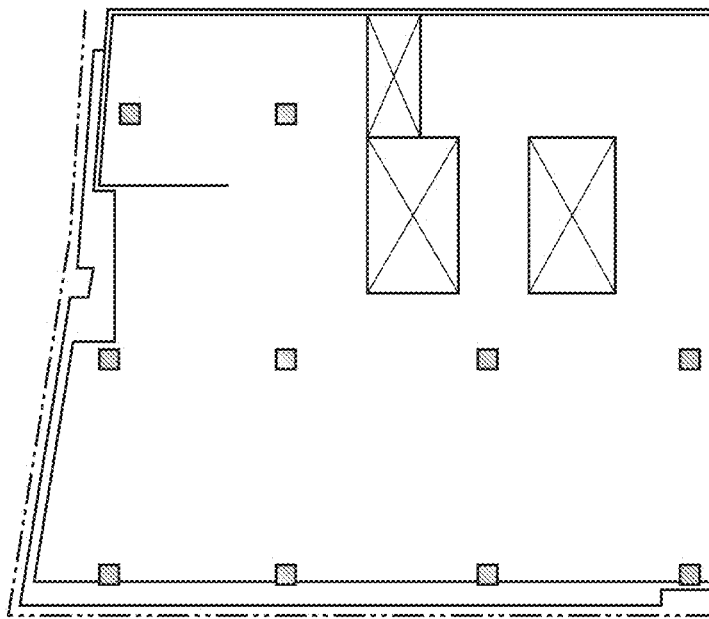

FIG. 8 presents an alternative representation of the same building data shown in FIG. 7, formatted specifically for structural system manufacturers. FIG. 8 illustrates a detailed floor plan 800 highlighting column placements and structural openings, accompanied by assembly specifications including concrete types and floor system details. The documentation 802 includes specific assembly codes (GC-558) and layer information for concrete specifications, demonstrating the system's ability to generate manufacturer-specific documentation from the optimized simulation results. FIG. 8 integrates with the query database architecture 190 of CAD system 102 to provide transparent access to structural specifications while maintaining consistency with the analysis-driven design decisions documented in the option analysis interface.

FIGS. 6-8 collectively demonstrate the comprehensive integration capabilities of the query database architecture 190, establishing a robust framework for project documentation, stakeholder accommodation and decision-making. The progression from analytical decision-making in FIG. 6 to the specialized manufacturer formats illustrated in FIGS. 7 and 8 creates a traceable pathway through the design process. This integration enables stakeholders to cross-reference between the quantitative analysis driving decisions and the resulting specifications, while manufacturers can access both the analytical justification for choices and their detailed requirements. The system maintains a verifiable audit trail through the scoring mechanisms illustrated in FIG. 6 and the manufacturer-specific documentation formats of FIGS. 7 and 8. This comprehensive approach ensures transparency by giving authorized stakeholders access to both the decision-making tools and resulting specifications, supporting data-driven decisions throughout the project lifecycle. The interconnected nature of these figures within the query database architecture 190 guarantees that design decisions, specifications, and manufacturer requirements remain consistently accessible and traceable, facilitating informed decision-making and maintaining data integrity across all project phases.

As described above, the present disclosure provides unprecedented technological improvements in the field of computer-aided building design through its novel implementation of real-time end-to-end automation. Unlike conventional systems that require weeks or months of manual processes and human intervention between initial design and procurement stages, the present disclosure's integrated computational architecture enables complete transformation of user inputs into manufacturer-ready documentation within minutes. This represents a dramatic and unexpected improvement in processing speed that was previously considered impossible in the building design industry.

The system achieves remarkable processing speed through several novel technical features working in concert.

Integrated Sequential Processing: The system employs a sophisticated sequential processing architecture with four interconnected functional modules—Generate, Populate, Simulate, and Publish. Each module's output seamlessly feeds into the next stage of processing, eliminating the traditional delays and manual interventions required between stages in conventional systems.

Real-Time Data Integration—The system implements novel data streaming protocols that enable instantaneous bi-directional communication between internal processing modules and external manufacturer databases. This eliminates the traditional lag time between design iterations and manufacturer feedback.

Intelligent Template Generation—The system employs machine learning algorithms that dynamically convert simulation outputs into manufacturer-specific documentation formats in real-time, automatically adjusting terminology, units, and specifications to match each manufacturer's established templates and requirements.

The disclosure represents a significant advancement in building design technology through specific technical improvements to computer functionality. The system's novel integrated sequential architecture and real-time data integration protocols directly address and solve the long-standing technical problem of processing inefficiencies in building design automation.

Rather than merely digitizing manual processes, the disclosure's computational architecture introduces fundamental technical improvements that enable previously impossible processing speeds. The system performs complex data transformations through its specialized computational framework, converting raw input parameters into sophisticated three-dimensional models and then into manufacturer-specific documentation. This transformation process implements novel technical solutions that revolutionize the speed and accuracy of building design automation.

The disclosure specifically addresses critical technical challenges in computer-aided design systems through its novel integrated sequential processing architecture, real-time data integration protocols, and intelligent template generation systems. These improvements result in tangible technical benefits, including: dramatic reduction in processing time from weeks to minutes, enhanced accuracy through automated data transformation, improved computational efficiency through seamless module integration, real-world practical applications in building design and procurement.

FIG. 9 is a diagrammatic representation of an example machine in the form of a system 1, within which a set of instructions for causing the machine to perform any one or more of the methodologies discussed herein may be executed. In various example embodiments, the machine operates as a standalone device or may be connected (e.g., networked) to other machines. In a networked deployment, the machine may operate in the capacity of a server or a client machine in a server-client network environment, or as a peer machine in a peer-to-peer (or distributed) network environment. The machine may be an Internet-of-Things device or system, a personal computer (PC), a tablet PC, a set-top box (STB), a personal digital assistant (PDA), a cellular telephone, a portable music player (e.g., a portable hard drive audio device such as a Moving Picture Experts Group Audio Layer 3 (MP3) player), a web appliance, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The system 1 includes a processor or multiple processor(s) 5 (e.g., a central processing unit (CPU), a graphics processing unit (GPU), or both), and a main memory 10 and static memory 15, which communicate with each other via a bus 20. The system 1 may further include a video display 35 (e.g., a liquid crystal display (LCD)). The system 1 may also include an alpha-numeric input device(s) 30 (e.g., a keyboard), a cursor control device (e.g., a mouse), a voice recognition or biometric verification unit (not shown), a drive unit 37 (also referred to as disk drive unit), a signal generation device 40 (e.g., a speaker), and a network interface device 45. The system 1 may further include a data encryption module (not shown) to encrypt data.

The drive unit 37 includes a computer or machine-readable medium 50 on which is stored one or more sets of instructions and data structures (e.g., instructions 55) embodying or utilizing any one or more of the methodologies or functions described herein. Instructions 55 may also reside, completely or at least partially, within the main memory 10 and/or within the processor(s) 5 during execution thereof by the system 1. The main memory 10 and the processor(s) 5 may also constitute machine-readable media.

Instructions 55 may further be transmitted or received over a network 70 via the network interface device 45 utilizing any one of a number of well-known transfer protocols (e.g., Hyper Text Transfer Protocol (HTTP)). While the machine-readable medium 50 is shown in an example embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the machine and that causes the machine to perform any one or more of the methodologies of the present application, or that is capable of storing, encoding, or carrying data structures utilized by or associated with such a set of instructions. The term "computer-readable medium" shall accordingly be taken to include, but not be limited to, solid-state memories, optical and magnetic media, and carrier wave signals. Such media may also include, without limitation, hard disks, floppy disks, flash memory cards, digital video disks, random access memory (RAM), read only memory (ROM), and the like. The example embodiments described herein may be implemented in an operating environment comprising software installed on a computer, in hardware, or in a combination of software and hardware.

The components provided in the system 1 of FIG. 9 are those typically found in systems that may be suitable for use with embodiments of the present disclosure and are intended to represent a broad category of such computer components that are well known in the art. Thus, the system 1 can be an Internet-of-Things device or system, a personal computer (PC), handheld system, telephone, mobile system, workstation, tablet, phablet, mobile phone, server, minicomputer, mainframe computer, wearable, or any other system. The computer may also include different bus configurations, networked platforms, multi-processor platforms, and the like. Various operating systems may be used including UNIX, LINUX, WINDOWS, MAC OS, PALM OS, QNX ANDROID, IOS, CHROME, TIZEN, and other suitable operating systems.

Some of the above-described functions may be composed of instructions that are stored on storage media (e.g., computer-readable medium). The instructions may be retrieved and executed by the processor. Some examples of storage media are memory devices, tapes, disks, and the like. The instructions are operational when executed by the processor to direct the processor to operate in accordance with the technology. Those skilled in the art are familiar with instructions, processor(s), and storage media.

In some embodiments, system 1 may be implemented as a cloud-based Computing environment, such as a virtual machine operating within a computing cloud. In other embodiments, the system 1 may itself include a cloud-based computing environment, where the functionalities of the system 1 are executed in a distributed fashion. Thus, the system 1, when configured as a computing cloud, may include pluralities of computing devices in various forms, as will be described in greater detail below.

In general, a cloud-based computing environment is a resource that typically combines the computational power of a large grouping of processors (such as within web servers) and/or that combines the storage capacity of a large grouping of computer memories or storage devices. Systems that provide cloud-based resources may be utilized exclusively by their owners or such systems may be accessible to outside users who deploy applications within the computing infrastructure to obtain the benefit of large computational or storage resources. The cloud is formed, for example, by a network of web servers that comprise a plurality of computing devices, such as the system 1, with each server (or at least a plurality thereof) providing processor and/or storage resources. These servers manage workloads provided by multiple users (e.g., cloud resource customers or other users). Typically, each user places workload demands upon the cloud that vary in real-time, sometimes dramatically. The nature and extent of these variations typically depends on the type of business associated with the user.

It is noteworthy that any hardware platform suitable for performing the processing described herein is suitable for use with the technology. The terms "computer-readable storage medium" and "computer-readable storage media" as used herein refer to any medium or media that participates in providing instructions to a CPU for execution. Such media can take many forms, including, but not limited to, non-volatile media, volatile media and transmission media. Non-volatile media include, for example, optical or magnetic disks, such as a fixed disk. Volatile media include dynamic memory, such as system RAM. Transmission media include coaxial cables, copper wire and fiber optics, among others, including the wires that comprise one embodiment of a bus. Transmission media can also take the form of acoustic or light waves, such as those generated during radio frequency (RF) and infrared (IR) data communications, as well as wireless communications (both short-range and long-range). Common forms of computer-readable media include, for example, a floppy disk, a flexible disk, a hard disk, magnetic tape, any other magnetic medium, a CD-ROM disk, digital video disk (DVD), any other optical medium, any other physical medium with patterns of marks or holes, a RAM, a PROM, an EPROM, an EEPROM, a FLASHEPROM, any other memory chip or data exchange adapter, a carrier wave, or any other medium from which a computer can read.

Various forms of computer-readable media may be involved in carrying one or more sequences of one or more instructions to a CPU for execution. A bus carries the data to system RAM, from which a CPU retrieves and executes the instructions. The instructions received by system RAM can optionally be stored on a fixed disk either before or after execution by a CPU.

Computer program code for carrying out operations for aspects of the present technology may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The foregoing detailed description includes references to the accompanying drawings, which form a part of the detailed description. The drawings show illustrations in accordance with exemplary embodiments. These example embodiments, which are also referred to herein as "examples," are described in enough detail to enable those skilled in the art to practice the present subject matter. The embodiments can be combined, other embodiments can be utilized, or structural, logical, and electrical changes can be made without departing from the scope of what is claimed. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive "or," such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

The corresponding structures, materials, acts, and equivalents of all means or step plus function elements in the claims below are intended to include any structure, material, or act for performing the function in combination with other claimed elements as specifically claimed. The description of the present technology has been presented for purposes of illustration and description but is not intended to be exhaustive or limited to the disclosure in the form disclosed. Many modifications and variations will be apparent to those of ordinary skill in the art without departing from the scope and spirit of the disclosure. Exemplary embodiments were chosen and described in order to best explain the principles of the present technology and its practical application, and to enable others of ordinary skill in the art to understand the disclosure for various embodiments with various modifications as are suited to the particular use contemplated.

What is claimed is:

1. A system comprising at least one processor and a memory storing instructions that, when executed by the at least one processor, cause the system to:
   receive, during a single active design session, a plurality of building design parameters via at least one input interface;
   generate, during the single active design session, a three-dimensional computational building model based on the received plurality of building design parameters and on data retrieved by accessing an internal system product repository having a generic product library and a manufacturer-specific product library;
   integrate, during the single active design session, generic and manufacturer-specific components and assemblies within the three-dimensional computational building model;
   execute, during the single active design session, at least one computational simulation on the integrated three-dimensional computational building model;

automatically generate, during the single active design session, a plurality of electronic documentation outputs based on results of the at least one computational simulation;

automatically transmit, during the single active design session, the generated plurality of electronic documentation outputs to external systems of contractors for requests for proposal (RFP) documents, manufacturers for requests for quotation (RFQ) documents, and regulatory authorities for compliance verification documents; and receive one or more electronic responses corresponding to the automatically transmitted requests for proposal (RFP), requests for quotation (RFQ) and regulatory compliance verification documents via at least one communication interface.

2. The system of claim 1, further comprising re-executing, over one or more iterations, the at least one computational simulation within a same single active design session based on different manufacturer-specific components and/or assemblies integrated into the three-dimensional computational building model.

3. The system of claim 1, wherein the at least one computational simulation of the three-dimensional computational building model is selected from a group consisting of: a static load analysis, a dynamic load analysis, a material properties validation, a foundation stability analysis, a frame stability analysis, a deflection analysis, an inter-story drift analysis, a reliability analysis, and a critical member definition.

4. The system of claim 1, wherein the receiving the plurality of building design parameters is selected from a group consisting of: retrieving a predefined building configuration from a building configuration database, accessing a geographic information system (GIS) database to retrieve land site map data parameters for a specified location; and accessing a municipal records database to retrieve building code requirements and zoning regulations for a specified location.

5. The system of claim 1, wherein the plurality of electronic documentation outputs comprise at least one of: contractor requests for proposal (RFP) documents, manufacturer requests for quotation (RFQ) documents, and regulatory compliance verification documents, wherein the RFP, RFQ and regulatory compliance documents are generated in a format that is compatible with documentation formats of the contractors, the manufacturers, and the regulatory authorities whose components, assemblies and services are selected for use with the three-dimensional computational building model at the integration step.

6. The system of claim 1, wherein the receiving the plurality of building design parameters comprises receiving user-defined input parameters comprising at least one of spatial-layout parameters, material selection parameters, and regulatory requirement parameters.

7. The system of claim 1, further comprising generating a data analytics package in addition to the plurality of electronic documentation outputs, wherein the data analytics package includes a database enabling stakeholders to perform ad-hoc business analysis on project data including cost analyses, performance metrics, material specifications, simulation results, and optimization outcomes generated during the design session.

8. The system of claim 1, further configured to identify generic products or manufacturer-specific products that match the plurality of building design parameters and to display the generic products or the manufacturer-specific products on the at least one input interface.

9. A method, comprising:
receiving, during a single active design session, a plurality of building design parameters via at least one input interface;

generating, during the single active design session, a three-dimensional computational building model based on the received plurality of building design parameters and on data retrieved by accessing an internal system product repository having a generic product library and a manufacturer-specific product library;

integrating, during the single active design session, generic and manufacturer-specific components and assemblies within the three-dimensional computational building model;

executing, during the single active design session, at least one computational simulation on the integrated three-dimensional computational building model;

automatically generating, during the single active design session, a plurality of electronic documentation outputs based on results of the at least one computational simulation;

automatically transmitting, during the single active design session, the generated plurality of electronic documentation outputs to external systems of contractors for requests for proposal (RFP) documents, manufacturers for requests for quotation (RFQ) documents, and regulatory authorities for compliance verification documents; and receiving one or more electronic responses corresponding to the automatically transmitted requests for proposal (RFP), requests for quotation (RFQ) and regulatory compliance verification documents via at least one communication interface.

10. The method of claim 9, further comprising re-executing, over one or more iterations, the at least one computational simulation within a same single active design session based on different manufacturer-specific components and/or assemblies integrated into the three-dimensional computational building model.

11. The method of claim 9, wherein the at least one computational simulation of the three-dimensional computational building model is selected from a group consisting of: a static load analysis, a dynamic load analysis, a material properties validation, a foundation stability analysis, a frame stability analysis, a deflection analysis, an inter-story drift analysis, a reliability analysis, and a critical member definition.

12. The method of claim 9, wherein receiving the plurality of building design parameters is selected from a group consisting of: retrieving a predefined building configuration from a building configuration database, accessing a geographic information system (GIS) database to retrieve land site map data parameters for a specified location; and accessing a municipal records database to retrieve building code requirements and zoning regulations for a specified location.

13. The method of claim 9, wherein the plurality of electronic documentation outputs comprise at least one of: contractor requests for proposal (RFP) documents, manufacturer requests for quotation (RFQ) documents, and regulatory compliance verification documents, wherein the requests for proposal (RFP), requests for quotation (RFQ) and regulatory compliance documents are generated in a format that is compatible with documentation formats of the contractors, the manufacturers, and the regulatory authorities whose components, assemblies and services are selected for use with the three-dimensional computational model at the integration step.

14. The method of claim 9, wherein the receiving the plurality of building design parameters comprises receiving user-defined input parameters comprising at least one of spatial-layout parameters, material selection parameters, and regulatory requirement parameters.

15. The method of claim 9, further comprising generating a data analytics package in addition to the plurality of electronic documentation outputs, wherein the data analytics package includes a database enabling stakeholders to perform ad-hoc business analysis on project data including cost analyses, performance metrics, material specifications, simulation results, and optimization outcomes generated during the design session.

16. The method of claim 9, further comprising identifying generic products or manufacturer-specific products that match the plurality of building design parameters and displaying the generic products or the manufacturer-specific products on the at least one input interface.

17. A non-transitory computer-readable storage medium, including instructions that, when executed by at least one processor, cause the at least one processor to perform operations to:
  receive, during a single active design session, a plurality of building design parameters via at least one input interface;
  generate, during the single active design session, a three-dimensional computational building model based on the received plurality of building design parameters and on data retrieved by accessing an internal system product repository having a generic product library and a manufacturer-specific product library;
  integrate, during the single active design session, generic and manufacturer-specific components and assemblies within the three-dimensional computational building model;
  execute, during the single active design session, at least one computational simulation on the integrated three-dimensional computational building model;
  automatically generate, during the single active design session, a plurality of electronic documentation outputs based on results of the at least one computational simulation;
  automatically transmit, during the single active design session, the generated plurality of electronic documentation outputs to external systems of contractors for requests for proposal (RFP) documents, manufacturers for requests for quotation (RFQ) documents, and regulatory authorities for compliance verification documents; and
  receive one or more electronic responses corresponding to the automatically transmitted requests for proposal (RFP), requests for quotation (RFQ) and regulatory compliance verification documents via at least one communication interface.

18. The non-transitory computer-readable storage medium of claim 17, further comprising re-executing, over one or more iterations, the at least one computational simulation within a same single active design session based on different manufacturer-specific components and/or assemblies integrated into the three-dimensional computational building model.

19. The non-transitory computer-readable storage medium of claim 17, wherein the at least one computational simulation of the three-dimensional computational building model is selected from a group consisting of: a static load analysis, a dynamic load analysis, a material properties validation, a foundation stability analysis, a frame stability analysis, a deflection analysis, an inter-story drift analysis, a reliability analysis, and a critical member definition.

20. The non-transitory computer-readable storage medium of claim 17, wherein the plurality of electronic documentation outputs comprise at least one of: contractor requests for proposal (RFP) documents, manufacturer requests for quotation (RFQ) documents, and regulatory compliance verification documents, wherein the requests for proposal (RFP), requests for quotation (RFQ) and regulatory compliance documents are generated in a format that is compatible with documentation formats of the contractors, the manufacturers, and the regulatory authorities whose components, assemblies and services are selected for use with the three-dimensional computational building model at the integration step.

* * * * *

UNITED STATES PATENT AND TRADEMARK OFFICE
CERTIFICATE OF CORRECTION

PATENT NO. : 12,430,479 B1
APPLICATION NO. : 19/003325
DATED : September 30, 2025
INVENTOR(S) : John Klein et al.

Page 1 of 1

It is certified that error appears in the above-identified patent and that said Letters Patent is hereby corrected as shown below:

In the Specification

In Column 9, Line 4, should read:
municipal records database 109-C, wherein

In the Claims

In Claim 12, Column 28, Line 50, should read:
12. The method of Claim 9, wherein the receiving the plurality Signed and Sealed this
Tenth Day of February, 2026

John A. Squires
*Director of the United States Patent and Trademark Office*